(12) United States Patent
Lian

(10) Patent No.: US 9,240,359 B2
(45) Date of Patent: Jan. 19, 2016

(54) 3D NAND STAIRCASE CD CONTROL BY USING INTERFEROMETRIC ENDPOINT DETECTION

(71) Applicant: Applied Materials, Inc., Santa Clara, CA (US)

(72) Inventor: Lei Lian, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/326,442

(22) Filed: Jul. 8, 2014

(65) Prior Publication Data

US 2015/0011027 A1     Jan. 8, 2015

Related U.S. Application Data

(60) Provisional application No. 61/843,838, filed on Jul. 8, 2013.

(51) Int. Cl.
| | |
|---|---|
| *H01L 21/00* | (2006.01) |
| *H01L 21/66* | (2006.01) |
| *G03F 7/40* | (2006.01) |
| *H01L 21/822* | (2006.01) |

(52) U.S. Cl.
CPC .................. *H01L 22/12* (2013.01); *G03F 7/40* (2013.01); *H01L 22/26* (2013.01); *H01L 21/8221* (2013.01)

(58) Field of Classification Search
None
See application file for complete search history.

(56) References Cited

U.S. PATENT DOCUMENTS

| | | |
|---|---|---|
| 7,786,020 B1 | 8/2010 | Kang et al. |
| 2010/0048003 A1 | 2/2010 | Sung et al. |
| 2011/0159442 A1 | 6/2011 | Ken et al. |
| 2011/0244666 A1 | 10/2011 | Kim et al. |
| 2013/0020611 A1 | 1/2013 | Gumaelius |
| 2013/0062735 A1 | 3/2013 | Fu et al. |
| 2013/0083589 A1 | 4/2013 | Or-Bach et al. |
| 2013/0109112 A1* | 5/2013 | Grimbergen .................... 438/16 |

* cited by examiner

*Primary Examiner* — Alexander Ghyka
(74) *Attorney, Agent, or Firm* — Patterson & Sheridan, LLP

(57) ABSTRACT

Embodiments of the present disclosure provide methods for forming stair-like structures with accurate profiles control in manufacturing three dimensional (3D) stacking of semiconductor chips using precise photoresist trimming process endpoint control. In one example, a method of determining a photoresist trimming endpoint for forming stair-like structures on a substrate includes performing a trimming process on a substrate to trim a patterned photoresist layer disposed on a film stack from a first width to a second width in a processing chamber, wherein the patterned photoresist layer exposes a portion of the film stack uncovered by the patterned photoresist layer during the trimming process, directing an optical signal to a surface of the patterned photoresist layer while trimming the patterned photoresist layer, collecting a return reflected optical signal reflected from the photoresist layer, and determining a trimming endpoint by analyzing the return optical signal reflected from the photoresist layer.

11 Claims, 7 Drawing Sheets

3D NAND STAIRCASE CD CONTROL BY USING INTERFEROMETRIC ENDPOINT DETECTION

CROSS-REFERENCE TO RELATED APPLICATIONS

This application claims the benefit of U.S. Provisional Application 61/843,838 filed on Jul. 8, 2013, which is incorporated by reference in its entirety.

BACKGROUND

1. Field

Embodiments of the present invention generally relate to methods of manufacturing a vertical type semiconductor device, and more particularly to methods of manufacturing a vertical type semiconductor device with stair-like structures using interferometric endpoint detection.

2. Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

A patterned mask, such as a photoresist layer, is commonly used in forming structures, such as gate structure, shallow trench isolation (STI), bite lines and the like, on a substrate by etching process. The patterned mask is conventionally fabricated by using a lithographic process to optically transfer a pattern having the desired critical dimensions to a layer of photoresist. The photoresist layer is then developed to remove undesired portion of the photoresist, thereby creating openings in the remaining photoresist.

In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. In manufacturing three dimensional (3D) stacking of semiconductor chips, stair-like structures are often utilized to allow multiple interconnection structures to be disposed thereon, forming high-density of vertical transistor devices.

When forming stair-like structures in a film stack disposed on a substrate, an etching process along with a photoresist trimming process are repeatedly performed to etch the film stack with sequentially trimmed photoresist layer as etching masks. In an exemplary embodiment depicted in FIG. 1A, a trimmed photoresist layer (not shown) may serve as an etching mask layer to transfer structures onto a film stack 100 disposed on a substrate 104 to form stair-like structures 110 on the substrate 104. The film stack 100 typically includes alternating layers of layers 102a, 102b (shown as $102a_1$, $102b_1$, $102a_2$, $102b_2$, ..., $102n_1$, $102n_2$), either conductive layers or insulating layers. During etching, the photoresist layer is sequentially trimmed to different dimensions while serving as an etch mask to form stair-like structures 110 having different widths.

During manufacturing of the stair-like structures 110 on the substrate 104, each stair formed in the stair-like structures 110 has its intended width to allow channels 120 to be formed thereon. In the situations wherein inaccurate control of the photoresist trimming rate or film stack etching rate has occurred, widths of each of the stair may not be formed as precisely as intended during manufacturing, resulting in asymmetric stair structure that may result in the in ability to properly locate the channels 120 on an intended location on the stair structure.

In the example depicted in FIG. 1B showing a magnified view of a portion of the stair-like structures 110 circled in FIG. 1A, the widths 150, 152 of each stair structure 120 are formed wider or narrower in different cases, as expected due to the inaccurate process control, thus resulting in the channels 120 (shown as 120a, 120b) not being properly located on each designated surface 164 or 160 of each stairs 110 (shown as 110a, 110b), resulting in a location shift in the channels 120 formed on the stair structure 110. For example, the first channel 120a is not entirely located on the designated surface 164, but rather partly located on the nearby undesignated surface 160. Similarly, a portion of the second channel 120b is formed on the undesignated surface 162, rather than the designated surface 160, resulting in channel location shift, eventually leading to device failure.

Thus, there is a need for improved methods and apparatus for forming symmetric stair-like structures with accurate profiles and dimension control for three dimensional (3D) stacking of semiconductor chips.

SUMMARY

Embodiments of the present invention provide an apparatus and methods for forming stair-like structures with accurate profiles and dimension control for manufacturing three dimensional (3D) stacked semiconductor chips with good control of photoresist trimming process endpoint control. In one example, a method of determining a photoresist trimming endpoint for forming stair-like structures on a substrate includes performing a trimming process on a substrate to trim a patterned photoresist layer disposed on a film stack from a first width to a second width in a processing chamber, wherein the patterned photoresist layer exposes a portion of the film stack uncovered by the patterned photoresist layer during the trimming process, directing an optical signal to a surface of the patterned photoresist layer while trimming the patterned photoresist layer, collecting a return reflected optical signal reflected from the photoresist layer, and determining a trimming endpoint by analyzing the return optical signal reflected from the photoresist layer.

In another example, a method of determining a photoresist trimming process endpoint includes performing a trimming process on a substrate to trim a patterned photoresist layer disposed on a film stack from a first width to a second width in a processing chamber, wherein the patterned photoresist layer exposes a portion of the film stack uncovered by the patterned photoresist layer during the trimming process, performing an etching process to etch a portion of the film stack exposed by the trimmed patterned photoresist layer, directing an optical signal to a surface of the trimmed patterned photoresist layer continuously during the trimming and the etching process, collecting a return reflected optical signal reflected from the trimmed patterned photoresist layer, determining a change of reflected intensify of the return reflected optical signal as collected, and calculating a photoresist thickness loss based on the change of the reflected intensity.

In yet another example, a method of determining a photoresist trimming process endpoint includes performing a trimming process on a substrate to trim a patterned photoresist layer disposed on a film stack from a first width to a second width in a processing chamber, wherein the patterned photoresist layer exposes a portion of the film stack uncovered by the patterned photoresist layer during the trimming process, performing an etching process to etch a portion of the film stack exposed by the trimmed patterned photoresist layer, repeatedly performing the trimming process and the etching process, directing an optical signal to a surface of the trimmed patterned photoresist layer continuously during the repeated trimming and the etching process, collecting a return reflected optical signal reflected from the trimmed patterned photoresist layer, and analyzing the return reflected optical signal to calculate a photoresist thickness loss.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides methods for forming stair-like structures on a substrate for three dimensional (3D) stacking of semiconductor chips. In one example, precise dimension control, accurate feature transfer and good process control during manufacturing may be obtained through collecting a reflective spectrum reflected from a substrate during the stair-like structures manufacturing process so as to determine an accurate photoresist trimming endpoint and the etching process endpoint. By determining a proper photoresist trimming endpoint and etching process endpoint, a precise dimension for each stair-like structure using each trimmed photoresist layer as an etching mask may be obtained, so as to form stair-like structures on the substrate with good profile and dimension control.

Figure 1A:
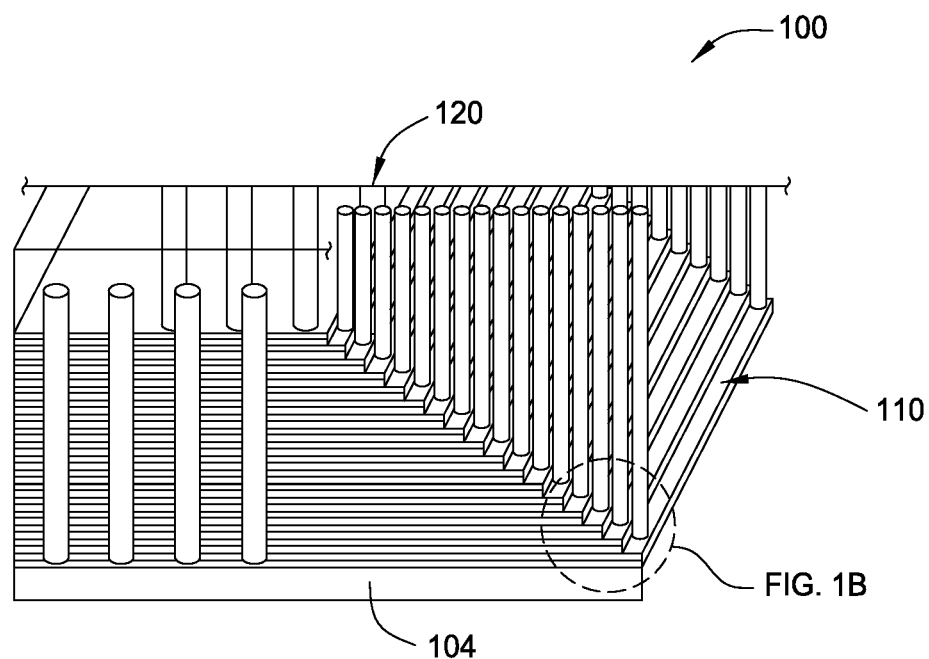
FIG. 1A depicts a schematic cross-sectional view of conventional stair-like structures formed on a substrate.
Figure 1B:
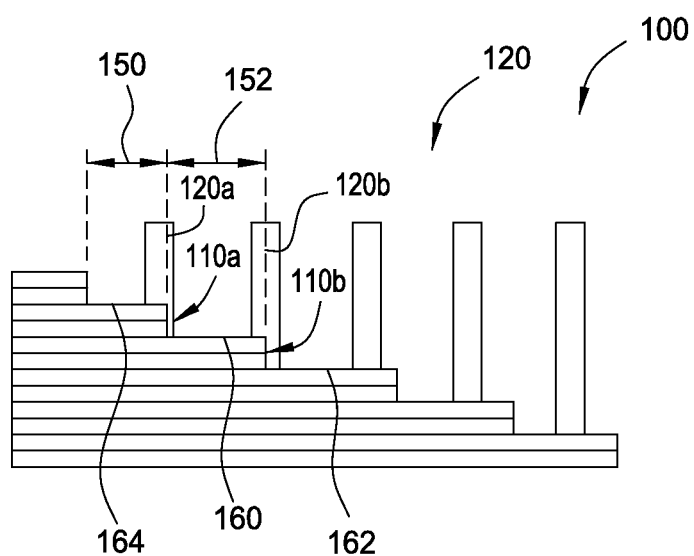
FIG. 1B depicts a portion of a schematic cross-sectional view of the conventional stair-like structures formed on the substrate of FIG. 1A.
Figure 2:
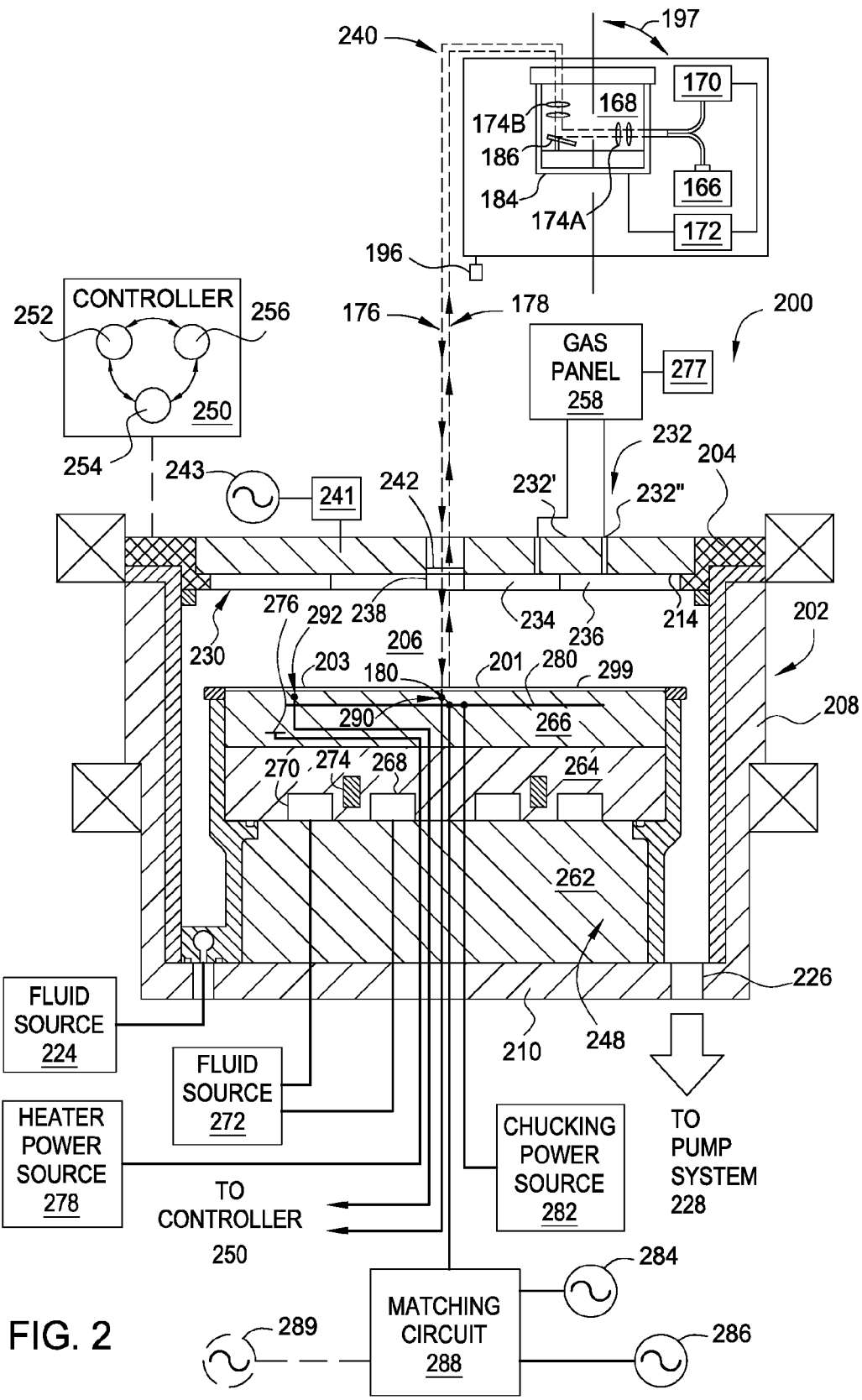
FIG. 2 depicts an apparatus utilized to form stair-like structures formed on a substrate in accordance with one embodiment of the present invention.

FIG. 2 is a sectional view of one embodiment of a processing chamber 200 suitable for detecting an endpoint for an etching and a photoresist trimming process to form stair-like structures in a film stack disposed on a substrate with desired uniformity across the substrate. Suitable processing chambers that may be adapted for use with the teachings disclosed herein include, for example, a modified ENABLER® processing chamber available from Applied Materials, Inc. of Santa Clara, Calif. Although the processing chamber 200 is shown including a plurality of features that enable superior etching and trimming performance, it is contemplated that other processing chambers may be adapted to benefit from one or more of the inventive features disclosed herein.

The processing chamber 200 includes a chamber body 202 and a lid 204 which enclose an interior volume 206. The chamber body 202 is typically fabricated from aluminum, stainless steel or other suitable material. The chamber body 202 generally includes sidewalls 208 and a bottom 210. A substrate support pedestal access port (not shown) is generally defined in a sidewall 208 and a selectively sealed by a slit valve to facilitate entry and egress of a substrate 299 from the processing chamber 200. An exhaust port 226 is defined in the chamber body 202 and couples the interior volume 206 to a pump system 228. The pump system 228 generally includes one or more pumps and throttle valves utilized to evacuate and regulate the pressure of the interior volume 206 of the processing chamber 200. In one embodiment, the pump system 228 maintains the pressure inside the interior volume 206 at operating pressures typically between about 10 mTorr to about 500 Torr.

The lid 204 is sealingly supported on the sidewall 208 of the chamber body 202. The lid 204 may be opened to allow excess to the interior volume 206 of the processing chamber 200. The lid 204 includes a window 242 that facilitates optical process monitoring from the optical monitoring system 240 disposed on the processing chamber 200. In one embodiment, the window 242 is comprised of quartz or other suitable material that is transmissive to a signal utilized by the optical monitoring system 240 mounted outside the processing chamber 200.

The optical monitoring system 240 is positioned to view at least one of the interior volume 206 of the chamber body 202 and/or the substrate 299 positioned on a substrate support pedestal assembly 248 through the window 242. In one embodiment, the optical monitoring system 240 is coupled to the lid 204 and facilitates an integrated deposition process that uses optical metrology to provide information that enables process adjustment to compensate for incoming substrate pattern feature inconsistencies (such as thickness, and the like), and to provide process state monitoring (such as plasma monitoring, temperature monitoring, and the like) as needed. One optical monitoring system that may be adapted to benefit from the invention is the EyeD® full-spectrum, interferometric metrology module, available from Applied Materials, Inc., of Santa Clara, Calif.

In one embodiment, the optical monitoring system 240 may be utilized to detect an endpoint for an etching process and/or a photoresist trimming process. The optical monitoring system 240 is configured to detect optical signals through the window 242 reflected from the substrate 299 or generated by the plasma formed within the processing chamber 200. It is noted that more than one window may be formed in the lid 204 or other locations of the processing chamber 200 which allows optical monitoring of various locations on the substrate 299 from its surface during etching or photoresist trimming process. Alternatively, different numbers of windows may be provided at other locations of the lid 204, chamber body 208 and/or substrate support pedestal assembly 248 as needed.

The optical monitoring system 240 comprises optical setup for operating in at least one of reflection, interferometry or transmission modes, and is configured for different types of measurements, such as reflectance or transmittance, interferometry, or optical emission spectroscopy, so as to determine an endpoint for an etching process and/or a photoresist trimming process. Depending on the application of interest, e.g., the material layers or substrate structure being processed, endpoints may be detected based on a change in the reflectance or transmittance intensities, the number of interference fringes, or changes in optical emission intensities at specific wavelengths, or combination thereofs. In one particular embodiment, the optical monitoring system 240 is configured to detect a process endpoint based on a change in the reflectance reflected from an etched or trimmed substrate surface.

The reflection mode of operation allows reflectance (or reflectometry) and interferometric measurement to be performed. The optical monitoring system 240 generally comprises a light source 166, a focusing assembly 168 for focusing an incident optical beam 176 from the light source 166 onto a discreet area (spot) 180 on the surface of substrate 299, and a photodetector 170 for measuring the intensity of a reflected optical beam 178 reflected off the spot 180 of the substrate 299. An adjustment mechanism 196 may be provided to set an angle of incidence 197 of the beam 176 so that the spot 180 may be selectively positioned on a desired location on the substrate 299. The adjustment mechanism 196 may be an actuator, set screw or other device suitable for setting the angle of incidence 197 by moving (tilting) the optical monitoring system 240 itself or a component therein, such as with an optical beam positioner 184. The photodetector 170 may be a single wavelength or multi-wavelength detector, or a spectrometer. Based on the measured signal of the reflected optical beam 178, a computer system 172 calculates portions of the real-time waveform and compares it with a stored characteristic waveform pattern to extract information relating to the etch process. In one embodiment, the calculation may be based on slope changes or other characteristic changes in the detected signals, either in reflection or transmission mode, for example, when a film is etched to a target depth. Alternatively, the calculation may be based on interferometric signals as the depth of a trench or the thickness of a film changes during etching. In other examples, more detailed calculations may be performed based on interferometric signals obtained over a wide spectrum in order to determine the depth, width or thickness at any point in the etch or trimming process to determine etch rate or trimming of the object being etched or trimmed.

The light source 166 may be monochromatic, polychromatic, white light, or other suitable light source. In general, the optical signal from the reflected optical beam 178 may be analyzed to extract information regarding the presence or absence of a layer (e.g., an photoresist layer or a dielectric or a conductive layer in a film stack), or the thickness of certain material layers within the spot 180. The intensity of the incident optical beam 176 is selected to be sufficiently high energy to provide the reflected optical beam 178 with a measurable intensity. The light source 166 can also be switched on and off to subtract background light. In one embodiment, the light source 166 provides polychromatic light, e.g., from an Hg—Cd lamp, an arc lamp, or a light emitting diode (LED) or LED array, which generates light in wavelength ranges from about 170 nm to about 800 nm, or about 200 to 800 nm, for example about 250 nm to about 800 nm. The polychromatic light source 166 can be filtered to provide an incident optical beam 176 having selected frequencies. Color filters can be placed in front of the photodetector 170 to filter out all wavelengths except for a desired wavelength of light, prior to measuring the intensity of the reflected optical beam 178 entering the photodetector 170. The light can be analyzed by a spectrometer (array detector with a wavelength-dispersive element) to provide data over a wide wavelength range, such as ultraviolet to visible, from about 200 nm to 800 nm. The light source 166 can also comprise a flash lamp, e.g., a Xe or other halogen lamp, or a monochromatic light source that provides optical emission at a selected wavelength, for example, a He—Ne or ND-YAG laser. The light source may be configured to operate in a continuous or pulsed mode. Alternatively, the wavelength range may be expanded into the deep UV as low as 170 nm or beyond using optical materials with stable deep UV transmission and purging air paths with inert gas or other suitable carrier gas, such as nitrogen gas.

One or more convex focusing lenses 174A, 174B may be used to focus the incident optical beam 176 to the spot 180 on the substrate surface, and to focus the reflected optical beam 178 back on the active surface of photodetector 170. The spot 180 should be sufficiently large to compensate for variations in surface topography of the substrate 299 and device design features. This enables detection of etch endpoints for high aspect ratio features having small openings, such as vias or deep narrow trenches, which may be densely present or more isolated. The area of the reflected optical beam 178 should be sufficiently large to activate a large portion of the active light-detecting surface of the photodetector 170. The incident and reflected optical beams 176, 178 are directed through the transparent window 242 in the processing chamber 200 that allows the optical beams to pass in and out of the processing environment.

The diameter of the beam spot 180 is generally about 2 mm to about 10 mm. However, if the beam spot 180 encompasses large isolated areas of the substrate 299 containing only a small number of etched features, it may be necessary to use a larger beam spot in order to encompass a greater number of etched features. The size of the beam spot can therefore be optimized, depending on the design features for a particular device. If the signal is sufficient, a large beam spot or field of view will enable process control without precisely matching the position of the substrate support hole and the etched area of the substrate giving rise to the signal.

Optionally, the optical beam positioner 184 may be used to move the incident optical beam 176 across the substrate 299 to a suitable portion of the substrate surface to monitor an etching process. The optical beam positioner 184 may include one or more primary mirrors 186 that rotate at small angles to deflect the optical beam from the light source 166 onto different positions of the substrate surface. Additional secondary mirrors may be used (not shown) to direct the reflected optical beam 178 on the photodetector 170. The optical beam positioner 184 may also be used to scan the optical beam in a raster pattern across the surface of the substrate 299. In this embodiment, the optical beam positioner 184 comprises a scanning assembly consisting of a movable stage (not shown), upon which the light source 166, the focusing assembly 168 and the photodetector 170 are mounted. The movable stage can be moved through set intervals by a drive mechanism, such as a stepper motor or galvanometer, to scan the beam spot 180 across the substrate 299.

The photodetector 170 comprises a light-sensitive electronic component, such as a photovoltaic cell, photodiode, phototransistor, or photomultiplier, which provides a signal in response to a measured intensity of the reflected optical beam 178. The signal can be in the form of a change in the level of a current passing through an electrical component or a change in a voltage applied across an electrical component. The photodetector 170 can also comprise a spectrometer (array detector with a wavelength-dispersive element) to provide data over a wide wavelength range, such as ultraviolet to visible, from about 170 nm to 800 nm. The reflected optical beam 178 undergoes constructive and/or destructive interference which increases or decreases the intensity of the optical beam, and the photodetector 170 provides an electrical output signal in relation to the measured intensity of the reflected optical beam 178. The electrical output signal is plotted as a function of time to provide a spectrum having numerous waveform patterns corresponding to the varying intensity of the reflected optical beam 178.

In another embodiment, a plasma signal, e.g., plasma emission generated in the plasma zone, may also be collected for detection as needed for different process requirements.

A computer program on the computer system 172 analyzes the shape of the measured waveform pattern of the reflected optical beam 178 to determine the endpoint of the etching and/or trimming process. The waveform generally has a sinusoidal-like oscillating shape, with the trough of each wavelength occurring when the depth of the etched feature causes the return signal to be 180 degrees out of phase with the return signal reflected by the overlaying layer. The endpoint may be determined by calculating the etch rate or trimming rate using the measured waveform, phase information of the measured waveform and/or comparison of the measured waveform to a reference waveform. As such, the period of the interference signal may be used to calculate the depth and etch rate. The program may also operate on the measured waveform to detect a characteristic waveform, such as, an inflection point indicative of a phase difference between light reflected from different layers. The operations can be simple mathematic operations, such as evaluating a moving derivative to detect an inflection point.

Referring back to the processing chamber 200, a gas panel 258 is coupled to the processing chamber 200 to provide process and/or cleaning gases to the interior volume 206. In the embodiment depicted in FIG. 2, inlet ports 232', 232" are provided in the lid 204 to allow gases to be delivered from the gas panel 258 to the interior volume 106 of the processing chamber 200. In one embodiment, the gas panel 258 is adapted to provide fluorinated process gas through the inlet ports 232', 232" and into the interior volume 206 of the processing chamber 200. In one embodiment, the process gas provided from the gas panel 258 includes at least a fluorinated gas, chlorine, and a carbon containing gas, an oxygen gas, a nitrogen containing gas and a chlorine containing gas. Examples of fluorinated and carbon containing gases include $CHF_3$ and $CF_4$. Other fluorinated gases may include one or more of $C_2F$, $C_4F_6$, $C_3F_8$ and $C_5F_8$. Examples of the oxygen containing gas include $O_2$, $CO_2$, $CO$, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include $HCl$, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 230 is coupled to an interior surface 214 of the lid 204. The showerhead assembly 230 includes a plurality of apertures that allow the gases flowing through the showerhead assembly 230 from the inlet ports 232', 232" into the interior volume 206 of the processing chamber 200 in a predefined distribution across the surface of the substrate 402 being processed in the processing chamber 200.

A remote plasma source 277 may be optionally coupled to the gas panel 258 to facilitate dissociating gas mixture from a remote plasma prior to entering into the interior volume 206 for processing. A RF source power 243 is coupled through a matching network 241 to the showerhead assembly 230. The RF source power 243 typically is capable of producing up to about 3000 W at a tunable frequency in a range from about 50 kHz to about 13.56 MHz.

The showerhead assembly 230 additionally includes a region transmissive to an optical metrology signal. The optically transmissive region or passage 238 is suitable for allowing the optical monitoring system 240 to view the interior volume 206 and/or the substrate 402 positioned on the substrate support pedestal assembly 248. The passage 238 may be a material, an aperture or plurality of apertures formed or disposed in the showerhead assembly 230 that is substantially transmissive to the wavelengths of energy generated by, and reflected back to, the optical monitoring system 240.

In one embodiment, the showerhead assembly 230 is configured with a plurality of zones that allow for separate control of gas flowing into the interior volume 206 of the processing chamber 200. In the embodiment FIG. 2, the showerhead assembly 230 as an inner zone 234 and an outer zone 236 that are separately coupled to the gas panel 258 through separate inlet ports 232', 232".

The substrate support pedestal assembly 248 is disposed in the interior volume 206 of the processing chamber 200 below the gas distribution (showerhead) assembly 230. The substrate support pedestal assembly 248 generally includes a plurality of lift pins (not shown) disposed therethrough that are configured to lift the 402 from the substrate support pedestal assembly 248 and facilitate exchange of the substrate 402 with a robot (not shown) in a conventional manner. An inner liner 218 may closely circumscribe the periphery of the substrate support pedestal assembly 248.

In one embodiment, the substrate support pedestal assembly 248 includes a mounting plate 262, a base 264 and an electrostatic chuck 266. The mounting plate 262 is coupled to the bottom 210 of the chamber body 202 includes passages for routing utilities, such as fluids, power lines and sensor leads, among other, to the base 264 and the electrostatic chuck 266. The electrostatic chuck 266 comprises at least one clamping electrode 280 for retaining a substrate 402 below showerhead assembly 230. The electrostatic chuck 266 is driven by a chucking power source 282 to develop an electrostatic force that holds the substrate 402 to the chuck surface, as is conventionally known. Alternatively, the substrate 402 may be retained to the substrate support pedestal assembly 248 by clamping, vacuum or gravity.

At least one of the base 264 or electrostatic chuck 266 may include at least one optional embedded heater 276, at least one optional embedded isolator 274 and a plurality of conduits 268, 270 to control the lateral temperature profile of the substrate support pedestal assembly 248. The conduits 268, 270 are fluidly coupled to a fluid source 272 that circulates a temperature regulating fluid therethrough. The heater 276 is regulated by a power source 278. The conduits 268, 270 and heater 276 are utilized to control the temperature of the base 264, thereby heating and/or cooling the electrostatic chuck 266. The temperature of the electrostatic chuck 266 and the base 264 may be monitored using a plurality of temperature sensors 290, 292. The electrostatic chuck 266 may further comprise a plurality of gas passages (not shown), such as grooves, that are formed in a substrate support pedestal supporting surface of the chuck 266 and fluidly coupled to a source of a heat transfer (or backside) gas, such as He. In operation, the backside gas is provided at controlled pressure into the gas passages to enhance the heat transfer between the electrostatic chuck 166 and the substrate 402.

In one embodiment, the substrate support pedestal assembly 248 is configured as a cathode and includes an electrode 280 that is coupled to a plurality of RF power bias sources 284, 286. The RF bias power sources 284, 286 are coupled between the electrode 280 disposed in the substrate support pedestal assembly 248 and another electrode, such as the showerhead assembly 230 or ceiling (lid 204) of the chamber body 202. The RF bias power excites and sustains a plasma discharge formed from the gases disposed in the processing region of the chamber body 202.

In the embodiment depicted in FIG. 2, the dual RF bias power sources 284, 286 are coupled to the electrode 280 disposed in the substrate support pedestal assembly 248 through a matching circuit 288. The signal generated by the RF bias power 284, 286 is delivered through matching circuit 288 to the substrate support pedestal assembly 248 through a single feed to ionize the gas mixture provided in the plasma processing chamber 200, thereby providing ion energy necessary for performing a deposition or other plasma enhanced process. The RF bias power sources 284, 286 are generally capable of producing an RF signal having a frequency of from about 50 kHz to about 200 MHz and a power between about 0 Watts and about 5000 Watts. An additional bias power source 289 may be coupled to the electrode 280 to control the characteristics of the plasma.

In one mode of operation, the substrate 402 is disposed on the substrate support pedestal assembly 248 in the plasma processing chamber 200. A process gas and/or gas mixture is introduced into the chamber body 202 through the showerhead assembly 230 from the gas panel 258. A vacuum pump system 228 maintains the pressure inside the chamber body 202 while removing deposition by-products.

A controller 250 is coupled to the processing chamber 200 to control operation of the processing chamber 200. The controller 250 includes a central processing unit (CPU) 252, a memory 254, and a support circuit 256 utilized to control the process sequence and regulate the gas flows from the gas panel 258. The CPU 252 may be any form of general purpose computer processor that may be used in an industrial setting. The software routines can be stored in the memory 254, such as random access memory, read only memory, floppy, or hard disk drive, or other form of digital storage. The support circuit 256 is conventionally coupled to the CPU 252 and may include cache, clock circuits, input/output systems, power supplies, and the like. Bi-directional communications between the controller 250 and the various components of the processing system 100 are handled through numerous signal cables.

Figure 3:
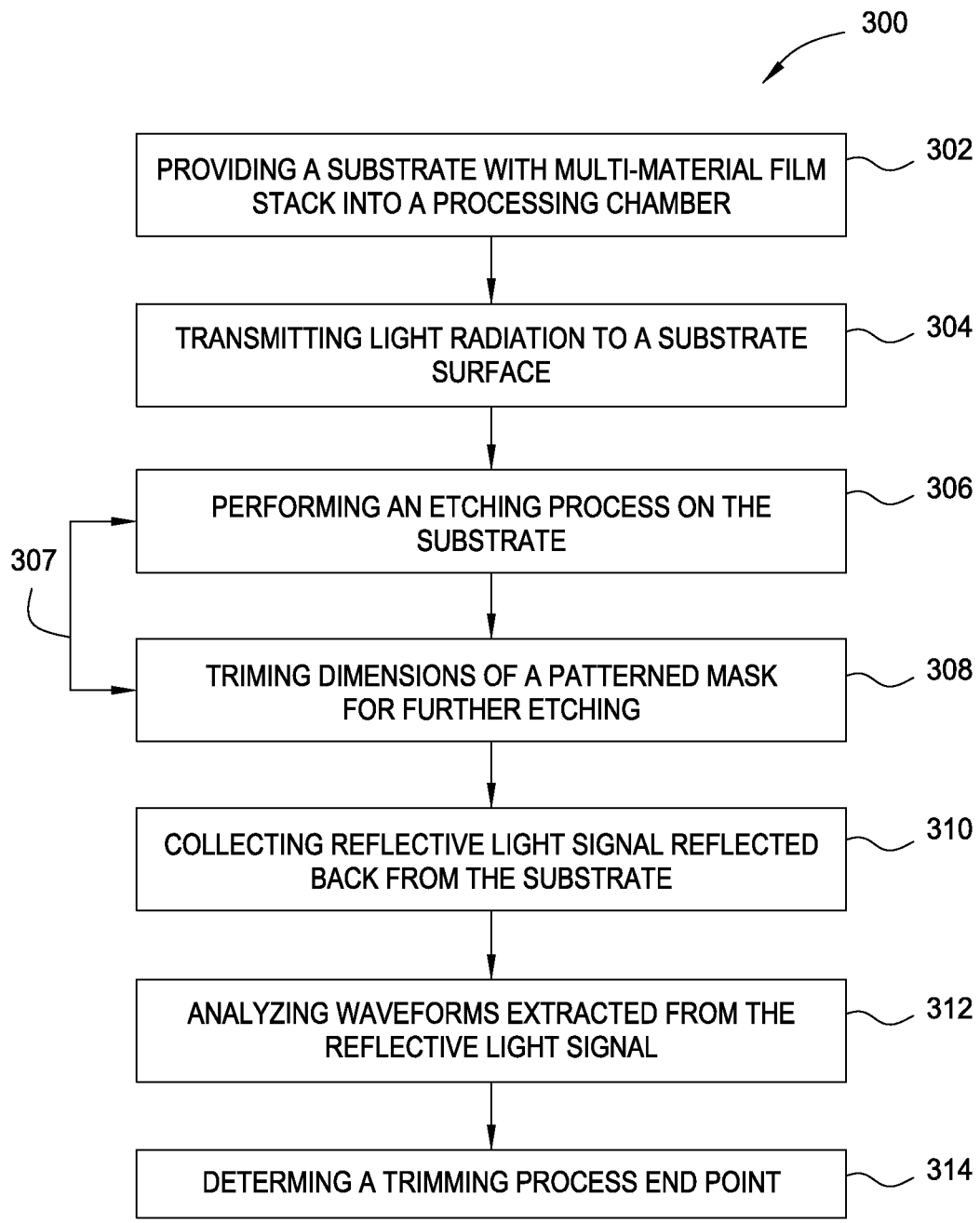
FIG. 3 depicts a flow diagram of a method for stair-like structures formed on a substrate in accordance with one embodiment of the present invention.

FIG. 3 is a flow diagram of one embodiment of a method 300 for detecting an endpoint for forming stair-like structures in a film stack disposed on a substrate that may be performed in a processing chamber, such as the processing chamber 200 depicted in FIG. 2 or other suitable processing chambers. FIGS. 4A-4F are schematic cross-sectional views illustrating a sequence for forming stair-like structures in a film stack disposed on a substrate according to the method 300. Although the method 300 is described below with reference to a substrate utilized to manufacture stair-like structures in a film stack for three dimensional semiconductor chips, the method 300 may also be used to advantage in other device manufacturing applications.

Figure 4A:
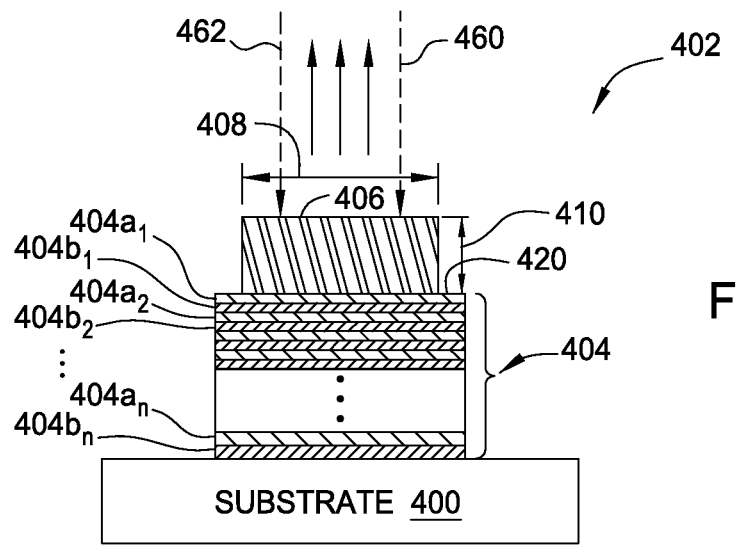
FIGS. 4A-4F depict one embodiment of a sequence for manufacturing stair-like structures formed on a substrate in accordance with the embodiment depicted in FIG. 3.

The method 300, which may be stored in computer readable form in the memory 254 of the controller 250, begins at block 302 by transferring a substrate, such as a substrate 400 depicted in FIG. 4A, onto the substrate support pedestal assembly 248 disposed in a processing chamber, such as the processing chamber 200 depicted in FIG. 2. The substrate 400 may be an silicon based material or any suitable insulating materials or conductive materials as needed, having a film stack 402 disposed on the substrate 400 that may be utilized to form desired stair-like structures in the film stack 402.

As shown in the exemplary embodiment depicted in FIG. 4A, the substrate 400 may have a substantially planar surface, an uneven surface, or a substantially planar surface having a structure formed thereon. The film stack 402 is formed on the substrate 400. In one embodiment, the film stack 402 may be utilized to form a gate structure, a contact structure or an interconnection structure in the front end or back end processes. The method 300 may be formed on the film stack 402 to form the stair-like structures therein. In one embodiment, the substrate 400 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 400 may have various dimensions, such as 200 mm, 300 mm, 450 mm or other diameter wafers, as well as, rectangular or square panels. Unless otherwise noted, embodiments and examples described herein are conducted on substrates with a 200 mm diameter, a 300 mm diameter, a 450 mm diameter substrate. In the embodiment wherein a SOI structure is utilized for the substrate 400, the substrate 400 may include a buried dielectric layer disposed on a silicon crystalline substrate. In the embodiment depicted herein, the substrate 402 may be a crystalline silicon substrate.

In one embodiment, the film stack 402 disposed on the substrate 400 may have a multi-material layer 404 that has a number of vertically stacked layers. The multi-material layer 404 may comprise pairs including a first layer (shown as $404a_1, 404a_2, \ldots, 404a_n$) and a second layer (shown as $404b_1, 404b_2, \ldots, 404b_n$) repeatedly formed in the multi-material layer 404. The pairs includes alternating first layer (shown as $404a_1, 404a_2, \ldots, 404a_n$) and second layer (shown as $404b_1, 404b_2, \ldots, 404b_n$) repeatedly formed until desired numbers of pairs of the first layers and the second layers are reached.

The multi-material layer 404 formed in the film stack 402 may be a part of a semiconductor chip, such as a three-dimensional (3D) memory chip. Although three repeating layers of first layers (shown as $404a_1, 404a_2, \ldots, 404a_n$) and second layers (shown as $404b_1, 404b_2, \ldots, 404b_n$) are shown in FIG. 4A-4F, it is noted that any desired number of repeating pairs of the first and the second layers may be utilized as needed.

In one embodiment, the multi-material layers 404 may be utilized to form multiple gate structures for a three-dimensional (3D) memory chip. The first layers $404a_1, 404a_2, \ldots, 404a_n$, formed in the multi-material layer 404 may be a first dielectric layer and the second layers $404b_1, 404b_2, \ldots, 404b_n$ may be a second dielectric layer. Suitable dielectric layers may be utilized to form the first layers $404a_1, 404a_2, \ldots, 404a_n$ and the second layers $404b_1, 404b_2, \ldots, 404b_n$ include silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others. In some embodiments, the dielectric layers may be a high-k material having a dielectric constant greater than 4. Suitable examples of the high-k materials include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others.

In some examples, the first layers $404a_1$, $404a_2$, ..., $404a_n$ and the second layers $404b_1$, $404b_2$, ..., $404b_n$ may be a conductive layer selected from a group consisting of polysilicon, doped silicon, such as n-type or p-type doped silicon, other suitable silicon containing material, tungsten (W), tungsten silicide (WSi), tungsten polysilicon (W/poly), tungsten alloy, tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, nitride compound thereof, such as titanium nitride (TiN) and tantalum nitride (TaN), and combinations thereof, among others.

In one particular example, the first layers $404a_1$, $404a_2$, ..., $404a_n$ are silicon oxide layers and the second layers $404b_1$, $404b_2$, ..., $404b_n$ are silicon nitride layers or polysilicon layers disposed on the first layers $404a_1$, $404a_2$, ..., $404a_n$. In one embodiment, the thickness of first layers $404a_1$, $404a_2$, ..., $404a_n$ may be controlled at between about 50 Å and about 1000 Å, such as about 500 Å, and the thickness of the each second layers $404b_1$, $404b_2$, ..., $404b_n$ may be controlled at between about 50 Å and about 1000 Å, such as about 500 Å. The multi-material layers 404 may have a total thickness between about 100 Å and about 2000 Å.

A patterned photoresist layer 406, a lithographically patterned mask, is then formed over the multi-material layer 404 exposing portions 420 of the first layers 404a for etching, as shown in FIG. 4A. In one embodiment, the photoresist layer 406 may is a positive tone photoresist, a negative tone photoresist, a UV lithography photoresist, an i-line photoresist, an e-beam resist (for example, a chemically amplified resist (CAR)) or other suitable photoresist. In one embodiment, the photoresist layer 406 may include organic polymer materials, such as fluoropolymers, silicon-containing polymers, hydroxy styrene, or acrylic acid monomers to provide acid groups when the photoresist layer 406 is exposed to radiation. The choice of the material for the photoresist layer 406 depends on the particular microelectronic device processing application being performed. In particular, the choice of the material for the photoresist layer 406 depends on the properties of the photoresist layer 406 at a given wavelength of radiation. In alternate embodiments, the photoresist layer 406 is optimized to a wavelength of radiation, e.g., 365 nm, 248 nm, 193 nm, 157 nm, and 13 nm. In one embodiment, the photoresist layer 406 may be deposited to have a first width 408 (e.g., an initial width) between about 20 µm and about 60 µm.

At block 304, an incident optical beam 460, such as the incident optical beam 176 from the optical monitoring system 240 depicted in FIG. 2, is directed to the substrate surface prior to, simultaneously with or after an etching process performed at block 306, or a photoresist trimming process at block 308. The incident optical beam 460, as shown in FIG. 4A, from the optical monitoring system 240 is directed, through one of the windows in the chamber lid, onto one or more areas of the substrate 400. Although in the example depicted in FIG. 4A the incident optical beam 406 is directed onto the photoresist layer 406, it is noted that the incident optical beam 406 may also be directed to the surface 420 of the multi-material layer 404 or the substrate surface collectively or individually as needed for etching rate endpoint determination.

The incident optical beam 460 is configured to be directed onto the photoresist layer 406 and/or the surface 420 of the multi-material layer 404 to be etched to form stair-like structures in the film stack 402 as needed. Alternatively, the plasma itself generated during an etching or photoresist trimming process may be used as the light source.

A return reflected optical signal 462, e.g., light reflected off the surface of etched surface or structures, is detected by the photodetector 170 of the optical monitoring system 240. Alternatively, the return reflected optical signal may be plasma light reflected off the substrate at the areas in which the photodetector 170 is aimed. During trimming of the photoresist layer 406, the intensity of the reflected optical signal 462 changes overtime. The time-varying intensity of the reflected optical signal 462 at a particular wavelength is then analyzed to determine at least one of the depth or width trimmed and/or etched and the etch rate, trimming rate and the end point of the trimming process and the etching process collectively or individually as needed.

Figure 4B:
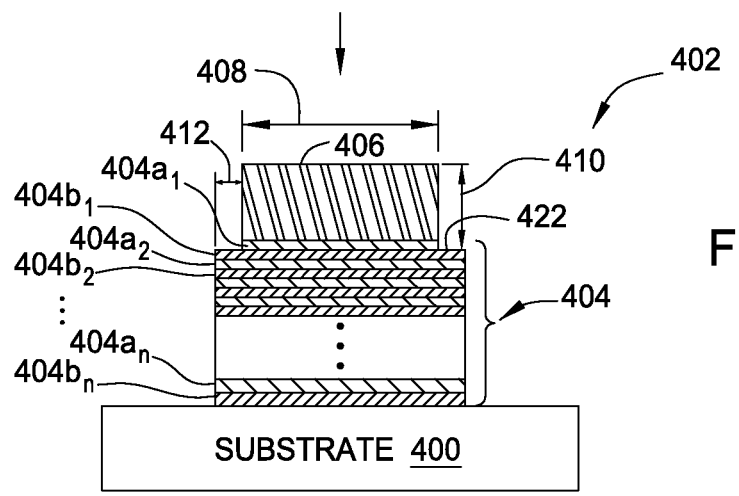
Figure 4C:
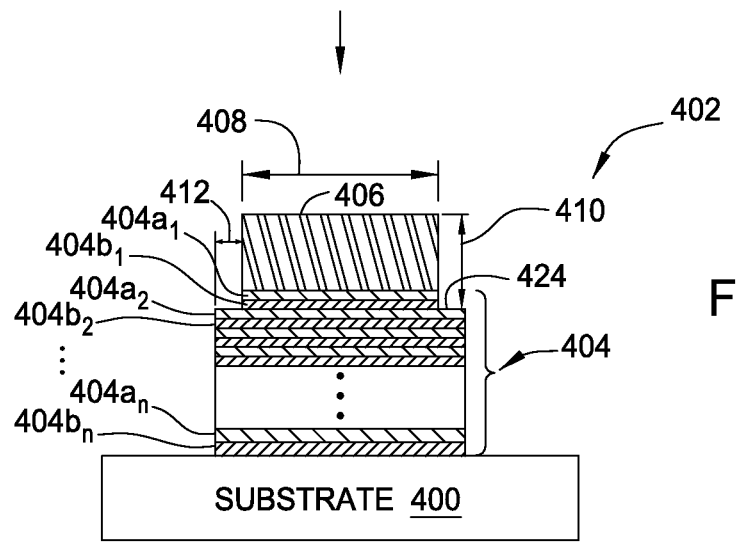

At block 306, an etching gas mixture is supplied into the processing chamber 200 to etch the first layer $404a_1$ of the multi-material layer 404 through the surface 420 exposed by the patterned photoresist layer 406. The etching process is continued until an underlying surface 422 of the second layer $404b_1$ of the multi-material layer 404 is exposed, as shown in FIG. 4B. The patterned photoresist layer 406 servers as an etching mask during the etching process of the first layer $404a_1$ of the multi-material layer 404. Subsequently, the etching process may be continuously performed to etch the second layer $404b_1$ of the multi-material layer 404 through the exposed surface 422 using one process step, such as a single etchant chemistry, or separately etched by multiple steps in one or different etching processes as needed. The patterns from the photoresist layer 406 are then transferred into the second layer $404b_1$, forming a first stair-like structure including the patterned first layer $404a_1$ and the second layer $404b_1$ in the film stack 402 through the etching process, as shown in FIG. 4C. The etching process may be continuously performed until a surface 424 of a first layer $404a_2$ included in another pair in the multi-material layer 404 is exposed with the patterned photoresist layer 406 disposed thereon.

In one embodiment, the etching gas mixture selected to etch the first layer $404a_1$ and the second layer $404b_1$ may have the same or different chemistries as needed. In one example, the etching gas mixture utilized to etch the first layer $404a_1$ includes $C_4F_6$, $C_4F_8$, $CF_4$, $CF_4$, $CHF_3$, $CH_2F_2$, $O_2$, or combinations thereof, optionally may include an inert gas, such as Ar or He. The etching gas mixture utilized to etch the second layer $404b_1$ includes $CH_3F$, $CH_2F_2$, $CHF_3$ or combinations thereof, and optionally may include an inert gas, such as Ar or He. In the embodiment wherein the first layer $404a_1$ is a silicon oxide layer, an etching gas mixture including $C_4F_6$, $C_4F_8$, $CF_4$, $CF_4$ or combinations thereof may be utilized. When the second layer $404b_1$ is a silicon nitride layer, an etching gas mixture including $CH_3F$, $CH_2F_2$, $CHF_3$, or combinations thereof may be utilized. During etching, the process pressure may be maintained between about 5 mTorr and about 30 mTorr. A RF source power may be controlled at between about 500 Watts and about 5000 Watts. A RF bias power may be controlled at between about 50 Watts and about 800 Watts.

It is noted that during the etching process, the incident optical beam 460 may be pulsed or continuously generated and directed onto the photoresist layer 406m or exposed surfaces 420, 422 of the film stack 402 as needed.

At block 308, after the etching process, a photoresist trimming process is performed. The photoresist trimming process is performed to reduce the first width 408 of the photoresist layer 406 to a second width 440, as indicated by an arrow 430 depicted in FIG. 4D. As the photoresist layer 406 as selected may have a substantially equal vertical trimming rate, as indicated by an arrow 428, to a horizontal trimming rate, as indicated by an arrow 426, the width change of the photoresist layer 406 in the horizontal and the vertical directions may be substantially equal. By such selection of the photoresist layer 406 as used, thickness consumption of the photoresist layer 406 may be easily detected and calculated by collecting reflective optical signal from any directions reflected from the photoresist layer 406 during the photoresist trimming process. The substantially equal vertical trimming rate 428 and horizontal (e.g., lateral) trimming rate 426 of the photoresist layer 406 may efficiently reduce endpoint detection noise interference that may possibly generate by thickness consumption mismatch from different directions while trimming the photoresist layer 406.

After the trimming process, a surface 444 of the first layer $404a_1$ is then exposed, ready for a second etching process to form another stair-like structure in the multi-material layer 404. The trimming process at block 308 and the etching process at block 306 may be in-situ performed in a single processing chamber using different chemistries.

In one embodiment, the trimming gas mixture is supplied to the etch chamber to trim the photoresist layer 406 to the second width 440 having a predetermined critical dimension. The trimming process is generally an isotropic trimming process. During trimming, the photoresist layer 406 is trimmed in both vertical direction 428 and in the lateral (e.g., horizontal) direction 426 before the trimmed photoresist layer 406 is utilized as the etch mask for the subsequent etching processes. As the dimension of the photoresist layer 406 may be further reduced during the subsequent etching process, which will be further described below, the trimming process performed at block 308 may be configured to trim the photoresist layer 406 to the predetermined second width 440, but not to the final and last dimension, so as to form a second stair-like structure in the multi-material layer 404 at this stage.

In one embodiment, the trimming process trims the first width 408, e.g., critical dimension, of the photoresist layer 406 from about 60 μm to the second width 440 of about 50 μm or less. The trimming gas mixture is selected to have a high selectivity for the photoresist layer 406 over the multi-material layer 404, thereby predominantly trimming the photoresist layer 406 rather than etching the exposed first stair-like structure in the multi-material layer 404 and the exposed surface 444 of the first layer $404a_1$. In one embodiment, the trimming gas mixture includes, but not limited to, an oxygen containing gas accompanying by optional nitrogen containing gas and/or an inert gas. Examples of the oxygen containing gas include $O_2$, NO, $N_2O$, $CO_2$, CO and the like. Examples of the nitrogen containing gas includes $N_2$, NO, $N_2O$, $NH_3$ and the like. Alternatively, inert gas, such as Ar or He, may also be incorporated with the first trimming gas into the etch chamber.

Several process parameters are regulated while the trimming gas mixture at block 308 supplied into the processing chamber. In one embodiment, the chamber pressure in the presence of the trimming gas mixture is regulated to a relatively high process pressure, such as greater than 25 mTorr, for example between about 30 mTorr to about 200 mTorr, for example, such as between about 33 mTorr and about 80 mTorr. The trimming gas mixture may include an oxygen gas flowed into the chamber at a rate between about 10 sccm to about 1000 sccm. The nitrogen containing gas may be supplied at a rate between about 20 sccm and about 200 sccm. In one example, the oxygen containing gas used in the trimming gas mixture is $O_2$ and the nitrogen containing gas used in the trimming gas is $N_2$. In an exemplary embodiment, the $O_2$ gas and $N_2$ gas is supplied in the trimming gas mixture at a $O_2$:$N_2$ ratio greater than about 5, such as between about 4:1 and about 10:1. A substrate temperature may be maintained between about 10 degrees Celsius to about 500 degrees Celsius, such as about 88 degrees Celsius.

RF source power may be applied to maintain a plasma formed from the trimming process gas. For example, a source power of about 500 Watts to about 5000 Watts, such as about 2500 Watts, may be applied to an inductively coupled antenna source to maintain a plasma inside the etch chamber. In one embodiment, a pulsed mode RF source power may be utilized during the trimming process. In one embodiment, the RF source power may be pulsed into the processing chamber 200 at a duty cycle between about 10 percent and about 90 percent.

It is noted that etching process at block 306 and the trimming process at block 308 may be repeatedly performed, as indicated by the loop 307, until a desired numbers of the stair-like structures are formed in the multi-material layer 404. Thus, after the trimming process, another etching process is performed to etch the first layer $404a_1$ to form a second stair-like structure in the first layer $404a_1$ using the trimmed photoresist layer 406 as an etching mask while further etching the first layer $404a_1$ through its exposed surface 444 (as shown in FIG. 4D) to reduce its initial dimension to the width defined by the trimmed photoresist layer 406, as shown in FIG. 4E, exposing a surface 446 of the underlying second layer $404b_1$.

Figure 4D:
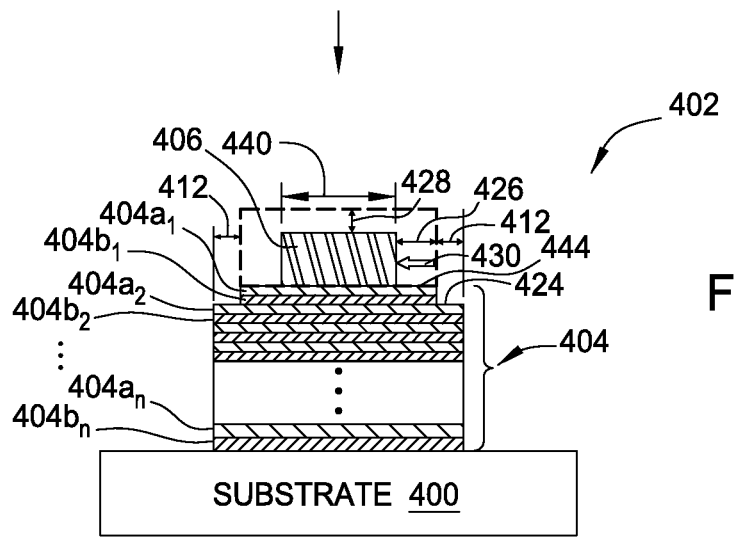
Figure 4E:
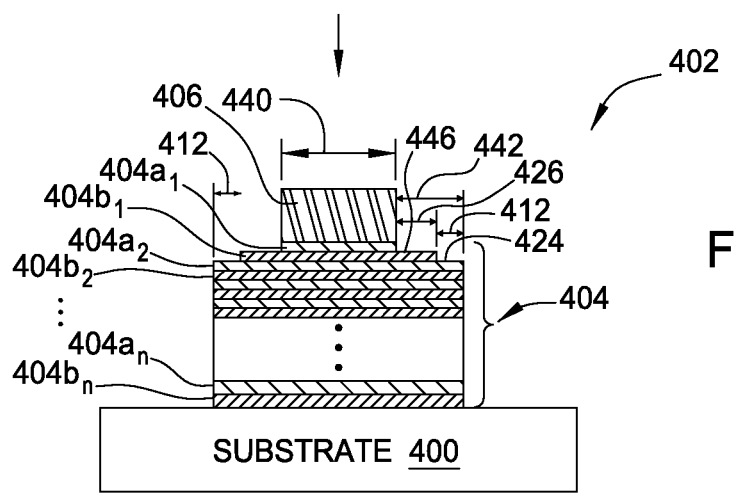

The second etching process is generally an anisotropic etch process (e.g., anisotropic plasma etch process) that mainly vertically etches the first layer $404a_1$ exposed by the trimmed photoresist layer 406 and the other first layer $404a_2$ exposed by the surface 424 (as shown in FIG. 4D). In one embodiment, the first layer $404a_1$ in the first pair and the other first layer $404a_2$ in the second pair are etched until an underlying upper surface 425 of the other second layer $404b_2$ in the second pair is exposed, forming the second stair-like structure in the multi-material layer 404. Accordingly, after the second etching process, at least two stair-like structures are formed respectively in the multi-material layer 404.

Similar to the first etching process described above at block 304, the second etching process may be the same or similar to the first etching gas mixture supplied at block 304 when the first and the second layers in the first and the second pairs are configured to have the same or similar materials. In another embodiment, the second etching gas mixture may have different chemistries to the first etching gas mixture when the layers in the first and the second pairs have different materials. In an exemplary embodiment depicted herein, the first etching gas mixture has the same chemistries as that of in the second etching gas mixture.

Figure 4F:
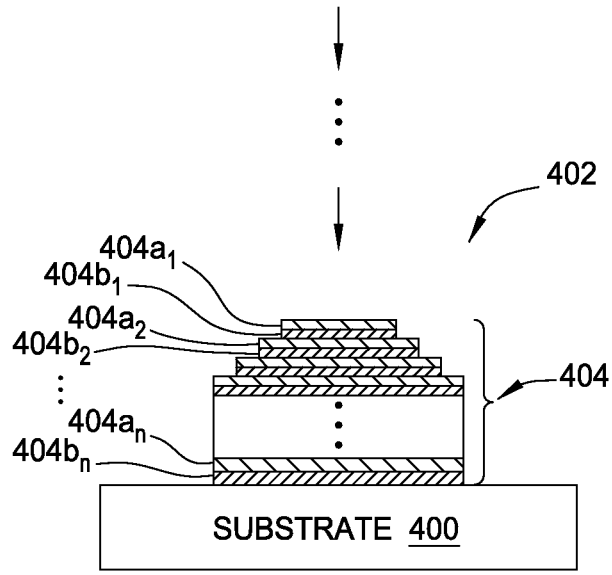

As discussed above, the trimmed photoresist layer 406 and the first stair-like structure may serve as etching masks during the etching process of forming the subsequent stair-like structure in the film stack 402. The first and the second layers in the multi-material layer 404 may be continuously etched using one process step, such as a single etchant chemistry, or separately etched by multiple steps in one or different etching processes as needed after each photoresist trimming process. The patterns from the trimmed photoresist layer 406 are then translated into each pair of the first and the second layers in the multi-material layer 404, forming the stair-like structure with gradual reduced dimensions, as shown in FIG. 4F. By using this trimming process and etching process performed by method 300, symmetric stair like structures with substantially symmetric widths at two sides of the stair like structures may be obtained.

At block 310, the return reflective optical signal 462 reflected from the photoresist layer 406 are collected. During the etching process at block 306 and the trimming process at block 308, the return reflective optical signal 460 is constantly and continuously directed to the photoresist layer 406, in some case even including the surfaces 420, 422, 424, 425 of the multi-material layer 404 as needed. As discussed above, as the photoresist layer 406 is selected to substantially have similar vertical trimming rate and the horizontal (e.g., lateral) trimming rate, the optical signal 460 may then be directed to any surfaces of the photoresist layer 406 without need of confinement of the optical signal 460 to only a certain designated region of the photoresist layer 406 (e.g., either vertically or horizontally) in order to get a precise trimming rate detection, as compared to those practices in the conventional techniques. The reflective optical signals 462 reflected from the photoresist layer 406 are constantly collected during the etching process at block 306 and the trimming process at block 308 so as to set up a database library and develop an algorithm/model so as to precisely determine an endpoint of each trimming process or each pair of the first layers $404a_1$, $404a_2$, ..., $404a_n$ and the second layers $404b_1$, $404b_2$, ..., $404b_n$ being etched on the substrate 400.

Figure 5A:
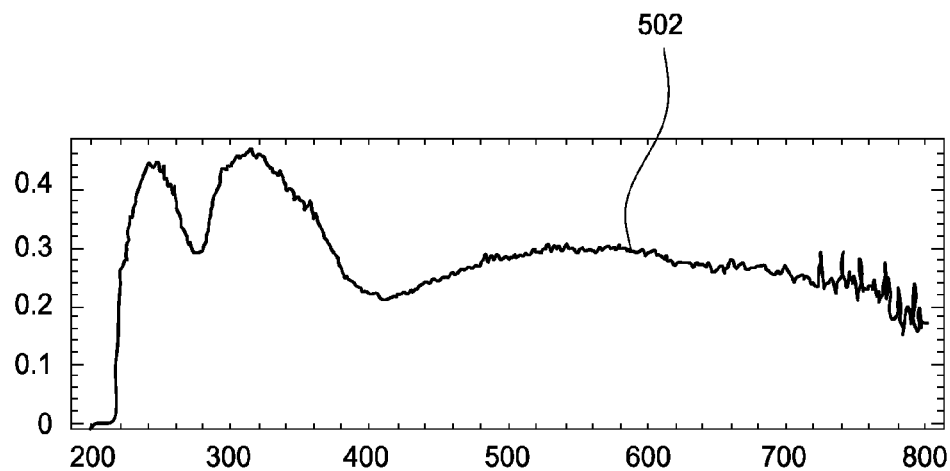
FIGS. 5A-5B depict a spectrum indicating a photoresist layer thickness variation during an etching process.
Figure 5B:
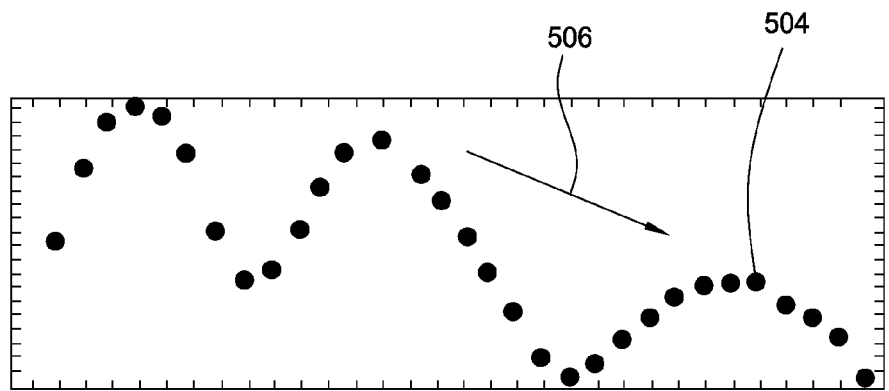

At block 312, the return reflective optical signals 462 reflected from the substrate surface as collected at block 310 is analyzed for trimming rate determination for each photoresist trimming process after each etching of each pair of the first layers $404a_1$, $404a_2$, ..., $404a_n$ and the second layers $404b_1$, $404b_2$, $404b_n$. FIGS. 5A-5B illustrate reflected optical signals as detected for photoresist trimming rate determination by monitoring reflection spectra of the substrates during trimming process. Prior to the detection of the return reflective optical signal 462 during the trimming process and the etching process, a referenced substrate may be processed to collect a referenced reflection spectrum for a baseline setup to be compared with a product substrate reflection spectrum so as to minimize noise from the background. The referenced reflection spectrum may be stored in the database library in the computer system 172 included in the optical monitoring system 240. In one example, the referenced substrate as selected for background subtraction is a bare silicon wafer.

After the etching and the trimming process, the optical signal 462 is collected to provide a spectrum 502, as shown in FIG. 5A, for indicating a thickness variation of the photoresist layer 406 during trimming process. The reflection spectrum 502 is plotted by a function of wavelength to provide a waveform pattern corresponding to the varying intensity of the reflected optical signal 462. The reflection spectrum 502 is compared to the reference substrate reflection spectrum stored in the database library so as to calculate and obtain the trimming rate/loss of thickness of the photoresist layer 406 disposed on the production substrate.

FIG. 5B depicts a spectrum 504 indicating thickness variation of the photoresist layer 406 extracted from the spectrum 502 of FIG. 5A at a particular selected spectral region, such as at a wavelength between about 200 nm and about 800 nm, using a spectral fitting algorithm. The spectrum 504 is obtained by computing ratio of the reflected intensity or the derivative of the reflected intensity with respect to time from the production substrate, such as the substrate 400, to a reference spectrum, such as a reference spectrum obtained from a bare silicon wafer, stored in the database library. After the ratio computation, a nominal reflectivity may be obtained and the nominal reflectivity may then be further extracted to form a minimal pattern. Based on the minimal pattern, a pattern match may be further computed so as to predict the thickness loss/variation of the photoresist layer 406 on the substrate 400. In the spectrum 504 of FIG. 5B, in total three cycles of thickness loss are extracted, indicating that photoresist layer thickness/variation has occurred three times, and the intensity of the reflected signal is also gradually tapered down, as shown by an arrow 506, indicating that the thickness of the photoresist layer 406 remaining on the substrate 400 has also gradually diminished. Thus, by analyzing the change of intensity of the extracted spectrum 504, an endpoint of intended photoresist layer thickness loss in each trimming process may be reliably determined at block 314. In the example depicted in FIG. 5B, it can be reasonably determined that three photoresist trimming processes have been performed to form the stair-like structures in the multi-material layer 404.

The return reflectived optical signal 462 may be detected real-time when the photoresist layer 406 is trimmed on the production substrate 400 in the processing chamber. Furthermore, based on the determination of the etch rate/loss of thickness of the photoresist layer 406 using the methods discussed above, the etch process parameters may be real-time adjusted using in-line statistical process control (in-line SPC) for optimization of the process.

Figure 6A:
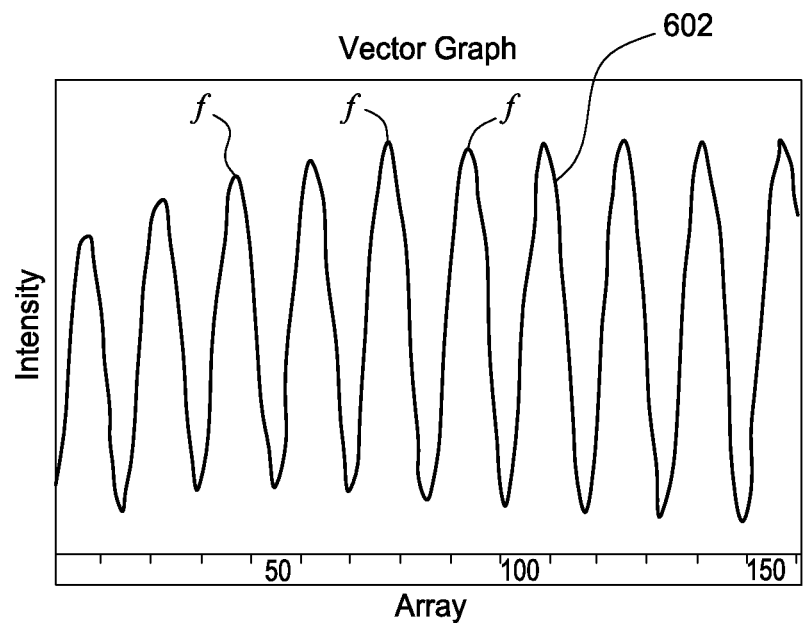
FIGS. 6A-6B depict spectrums reflected back from a substrate during an etching process.
Figure 6B:
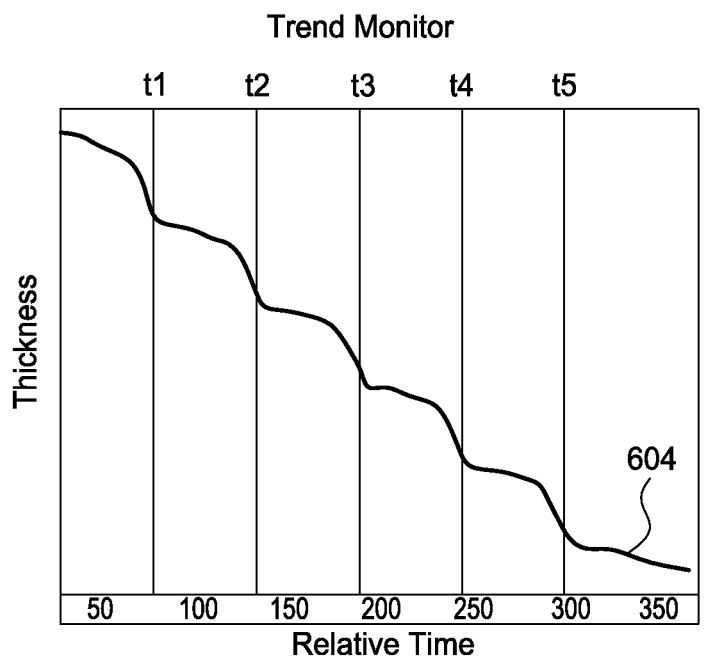

FIG. 6A depict a spectrum 602 obtained during the trimming process of the photoresist layer 406 using broadband spectral fitting algorithms. The spectrum 602, as shown in FIG. 6A, is plotted providing a waveform pattern corresponding to the varying intensity of the reflected optical signal 462 at a broadband range of wavelengths. The broadband spectral fitting algorithm is used to extract photoresist thickness value at every data interval during trimming to reduce latency typically seen in time series analysis and increase measurement accuracy. In one example, the thickness loss of the photoresist layer 406 during the each trimming process may be obtained by calculating the number of fringes (f) present in the spectrum 602. Each fringes (f) is equal to one wavelength (e.g., period) of the reflected optical signal 462 that travels through different thickness of the photoresist layer 406. Thus, by efficiently calculating the fringes, which that are indicative of the thickness changes in the photoresist layer 406, numbers and cycles of the photoresist trimming process may be determined. In the example depicted in FIG. 6B, by monitoring the number of the fringes detected in the reflected optical signal 462, the thickness loss of the photoresist layer 406 may be determined in each trimming cycle by converting the spectrum 602 to a thickness variation monitor trace 604 plotted as a function of time shown in FIG. 6B. Between each time point, $t_1, t_2, t_3, t_4, t_5$, a thickness loss of about 1000 nm may be observed between each time point, thus properly and efficiently determining a proper trimming endpoint of each cycle of the photoresist trimming process. By reviewing the thickness monitor trace 604 in FIG. 6B, the thickness consumption in each trimming process may be calculated and determined, so that the thickness of the photoresist layer 406 remaining on the substrate 402 may also be calculated by subtracting the consumed thickness from the photoresist original (e.g., initial) thickness. As such, a proper number of the photoresist trimming process may be calculated and the time period of each trimming process may also be determined based on the dimension change requirement to be formed in the photoresist layer 406 utilized to form stair-like structures in the multi-material layer 404.

By monitoring reflectivity of an optical beam reflected from an trimmed photoresist layer at a predetermined wavelength, proper trimming process endpoints may be determined by analyzing waveforms obtained from the reflected optical beam reflected from each cycle of the photoresist trimming process. The examples described herein provide an improved apparatus and method with enhanced process monitoring and control capabilities. These improvements also allow reliable trim rate/loss of thickness and endpoint determination for photoresist trimming process for stair-like structure fabrication applications.

Thus, methods and apparatus for forming stair-like structures for manufacturing three dimensional (3D) stacking of semiconductor chips are provided. The methods and the apparatus may advantageously provide a photoresist trimming endpoint with enhanced accuracy by obtained a reflective optical signal reflected from the trimmed photoresist layer, thereby improving the dimension and profile control of the resultant stair-like structures formed in a film stack disposed on a substrate in applications for three dimensional (3D) stacking of semiconductor chips.

While the foregoing is directed to embodiments of the present invention, other and further embodiments of the invention may be devised without departing from the basic scope thereof, and the scope thereof is determined by the claims that follow.

The invention claimed is:

1. A method of determining a photoresist trimming endpoint for forming stair-like structures on a substrate, comprising:
    performing a trimming process on a substrate to trim a patterned photoresist layer disposed on a film stack from a first width to a second width in a processing chamber, wherein the patterned photoresist layer exposes a portion of the film stack uncovered by the patterned photoresist layer during the trimming process;
    directing an optical signal to a surface of the patterned photoresist layer while trimming the patterned photoresist layer;
    collecting a return reflected optical signal reflected from the photoresist layer;
    analyzing a waveform indicating a reflected intensity change over different wavelengths obtained during the photoresist trimming process;
    comparing the reflected intensify with an intensify obtained from a referenced waveform obtained from a reference substrate;
    computing a ratio of the reflected intensity obtained during the photoresist trimming process with an reflected intensity obtained from the referenced waveform from a reference substrate to obtain a nominal reflectivity; and
    extracted a minimal pattern from the nominal reflectivity to determine photoresist thickness loss; and
    determining a trimming endpoint by analyzing the return optical signal reflected from the photoresist layer.

2. The method of claim 1, wherein the reference substrate is a bare-silicon substrate.

3. The method of claim 1, wherein the minimal pattern is fringes shown in the waveform.

4. The method of claim 1, wherein the photoresist layer has a substantially similar lateral and vertical trimming rates.

5. The method of claim 1, wherein the trimming process endpoint is obtained when a determined photoresist thickness loss is obtained.

6. The method of claim 1, wherein performing a trimming process on a substrate further comprises:
    performing an etching process to etch a portion of the film stack exposed by the patterned photoresist layer.

7. The method of claim 1, wherein the film stack includes a multi-material layer made from repeated pairs of layers.

8. The method of claim 7, wherein each repeated pair includes first layer that is a dielectric layer and a second layer that is a dielectric layer or a conductive layer.

9. The method of claim 1, directing the optical signal further comprises:
    generating a plasma within the processing chamber.

10. The method of claim 8, wherein the first layer is a silicon oxide layer and the second layer is a silicon nitride layer.

11. The method of claim 6, wherein the photoresist trimming process and the etching process may be repeated performed to gradually trim dimension of the photoresist layer in each trimming process cycle to form stair-like structures in the film stack.

* * * * *